(12) United States Patent
Halsey et al.

(10) Patent No.: US 6,663,025 B1
(45) Date of Patent: Dec. 16, 2003

(54) DIFFUSER AND RAPID CYCLE CHAMBER

(75) Inventors: Harlan I. Halsey, Woodside, CA (US); Dave E. Jacob, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 56 days.

(21) Appl. No.: 09/823,424

(22) Filed: Mar. 29, 2001

(51) Int. Cl.7 .................................................. B05B 1/14
(52) U.S. Cl. ....................... 239/554; 239/524; 239/555; 239/558; 118/715
(58) Field of Search ................................ 239/502, 522, 239/521, 523, 524, 554, 555, 559, 552, 558; 118/715, 723 R

(56) References Cited

U.S. PATENT DOCUMENTS

| | | | | |
|---|---|---|---|---|
| 3,992,137 A | * | 11/1976 | Streisel | 239/554 |
| 4,165,963 A | * | 8/1979 | Nozaki | 239/554 |
| 4,287,673 A | * | 9/1981 | Wolter | 239/524 |
| 5,209,402 A | * | 5/1993 | DeBra et al. | 239/524 |
| 5,308,989 A | | 5/1994 | Brubaker | 250/441.11 |
| 5,595,602 A | * | 1/1997 | Harlan | 118/715 |
| 6,113,700 A | | 9/2000 | Choi | |
| 6,299,436 B1 | * | 10/2001 | Huang | 239/555 |

OTHER PUBLICATIONS

Abstract of Japanese Patent Publication No. 11–029869, Patent Abstracts of Japan, vol. 1999, No. 5, May 31, 1999.

* cited by examiner

Primary Examiner—Steven J. Ganey
(74) Attorney, Agent, or Firm—Martine & Penilla, LLP

(57) ABSTRACT

The present invention provides a diffuser and a chamber for venting and/or pumping gas. The diffuser includes a body, a reflector, and a set of vanes. The body includes a nozzle through a center portion and has a curved surface on an upper side to define an open space above the curved surface. The nozzle is arranged to allow a gas to flow through and expand in the nozzle. The reflector is disposed over the nozzle and is arranged to reflect the gas from the nozzle into the open space in the body while expanding the gas flow. The vanes further divide the flow into roughly equal portions. In this configuration, the flow of the gas is slowed in the nozzle, the reflector portion, and the open space in the body between the vanes so that the gas flows out of the open space with substantially uniform low velocity.

37 Claims, 5 Drawing Sheets

DIFFUSER AND RAPID CYCLE CHAMBER

BACKGROUND OF THE INVENTION

1. Field of the Invention

The present invention relates to the manufacture of semiconductor devices. More specifically, the present invention relates to diffusers in plasma processing systems.

2. Description of the Related Art

Semiconductor processing systems are used to process semiconductor wafers for fabrication of integrated circuits. In particular, plasma-based semiconductor processes are commonly used in etching, oxidation, chemical vapor deposition (CVD), etc. Conventional plasma processing systems typically control gas or plasma flow in a plasma processing chamber to provide an optimum environment for processing the wafer.

In addition, these systems generally include other chambers for handling and transporting wafers between atmosphere and vacuum to ensure a clean process environment. To process a wafer, for example, the wafer in atmosphere is transported to a wafer load lock, which is a chamber that cycles between vacuum and atmosphere. When the wafer is placed in the wafer load lock, the load lock will contain atmosphere. The air in the atmosphere is then pumped out to provide a vacuum condition in the load lock chamber. The wafer is then transported to the processing chamber by a robotic arm operating in a vacuum chamber. The processing chamber processes (e.g., etching, oxidation, CVD, etc.) the wafer by exposing it to gas or plasma, which are pumped into and out of the chamber. This process changes the characteristics of the wafer.

After the wafer has been processed, the robotic arm in the vacuum transfer module moves the wafer back to the load lock in vacuum condition. Once the wafer is placed in the load lock, the vacuum pressure in the load lock is changed back to atmospheric pressure by flowing in a gas such as $N_2$. When atmospheric pressure has been achieved, the wafer is transported to a wafer cassette for other processing steps, if necessary.

In semiconductor processing, the value of a process system depends to a large extent on the rate at which wafers can be processed. That is, a process system with higher process rate will produce more processed wafers in a given amount of time than a system with lower process rate. Thus, the greater the process rate, the more valuable a process system is due to the greater throughput.

In conventional semiconductor process systems, however, the process rate of wafers depends largely on the speed with which chambers such as load lock, vacuum transfer module, and process chamber can be cycled between low and high pressure states. Unfortunately, the cycle speed of a chamber in conventional process systems is generally limited in practice by the maximum local velocity of the in-coming gas and outgoing gases. For example, too high a velocity may move the wafer out of position. Further, if the maximum velocity of the gases is too high, the gases may entrain small particles in the vacuum chamber and redistribute some of them onto the wafer surface. As can be appreciated, particulate surface contaminants may lead to failures of integrated circuits made from such wafer. To prevent such failures, therefore, the local velocity needs to be maintained below a certain level.

To address such problems, conventional chambers often include diffusers to slow the incoming gas flow by spreading the flow evenly over a wider area in the chambers. To provide such functions, a diffuser is typically equipped with a membrane provided at the chamber interface. The membrane typically consists of fabric, sintered metal, or a plate with many small holes in it. In this configuration, a cavity behind the membrane serves to spread the flow over a wider area. The membrane provides a resistance to the flow. This resistance allows the pressure to equalize behind the membrane. The uniform pressure and the uniform membrane resistance provide a uniform flow.

However, conventional diffusers equipped with membranes have several drawbacks. For example, such diffusers tend to be expensive because they need to retain substantial pressure. Typically, several pounds of pressure across the membrane are required. The membrane thus needs to be strong enough to withstand the pressure and yet allow gas to flow uniformly through, thereby adding to the cost of diffusers or limiting the speed of the venting portion of the cycle. Further, during the pumping part of the cycle, the membrane may hinder gas flow, thereby slowing down the pump cycle. In addition, the small holes in the membranes may trap minute particles during venting and/or pumping cycles. Due to these particles, the pumping and venting efficiencies may degrade over time or the particles may be released into the vent flow and land on the wafer surface. In addition, the membranes in the diffusers may be difficult to clean.

In view of the foregoing, what is desirable is a diffuser which an provide the required large area and low velocity flow in both pump and vent parts of the cycle with low resistance to the flows. This will allow an increase in the wafer process rate. In addition, a diffuser through which both pumping and venting can take place will be an advantage because of cost savings and/or the ability to fit a larger diffuser with the available space.

SUMMARY OF THE INVENTION

Broadly speaking, the present invention fills these needs by providing a diffuser and a rapid cycle chamber for venting and/or pumping gas. It should be appreciated that the present invention can be implemented in numerous ways, including as a process, an apparatus, a system, a device, or a method. Several inventive embodiments of the present invention are described below.

In accordance with one embodiment, the present invention provides a diffuser that includes a body and a reflector. The body includes a nozzle through a center portion and has a curved surface on an upper side to define an open space above the curved surface. The nozzle is arranged to allow a gas to flow through and expand in the nozzle. The reflector is disposed over the nozzle and is arranged to reflect the gas from the nozzle into the open space in the body while expanding the gas flow. In this configuration, the flow of the gas is slowed in the nozzle, the reflector portion, and the open space in the body so that the gas flows out of the open space with low velocity.

In another embodiment, the present invention provides a chamber for cycling gas in a semiconductor processing system. The chamber includes a set of enclosed walls and a diffuser. The diffuser is mounted in an aperture in an enclosed wall of the chamber. The diffuser includes a body, a reflector, and a set of vanes. The body includes a nozzle through a center portion and has a curved surface on an upper side to define an open space above the curved surface. The nozzle is arranged to allow a gas to flow through and expand the gas flow. The reflector is disposed over the nozzle and is arranged to reflect the gas from the nozzle into the open space in the body while expanding the gas flow. In this configuration, the flow of the gas expands and slows in the nozzle, the reflector, and the open space into the chamber with low velocity. The set of vanes is disposed in the open space of the body for partitioning the open space into a set of expansion spaces such that the gas flows out of each expansion space in substantially equal amounts from the partitioned spaces into the chamber. The number and shape of the vanes are chosen to provide a substantially uniform flow out of the open space into the chamber.

In yet another embodiment, a flow restrictor is disposed on the inlet to limit the velocity of an input gas. In one embodiment, a separate sonic flow restrictor may be utilized to limit the gas flow into the nozzle to slow the gas flow and prevent a burst of gas flow into the nozzle when the upstream valve is opened.

The present invention provides substantial advantages over conventional diffusers. For example, the diffuser of the present invention may be used to vent gas into a chamber or pump the gas out of a chamber. When used in venting, for example, the nozzle, reflector, and expansion hollow expand the incoming gas flow gradually in a small height. Due to the low and uniform gas flow into the chamber, wafers in the chamber will not be moved out of position. In addition, minute particles within the chamber are less likely to be entrained in the flow and deposited onto a wafer in the chamber. Accordingly, the diffuser and chamber equipped with such a diffuser of the present invention increase wafer throughput and/or device yield in a semiconductor processing system. On the other hand, the diffuser may also be used to pump the chamber to vacuum. By using the diffuser in this mode, the chamber need not employ a separate pumping port or device, thereby saving space in the chamber or allowing a larger diffuser to be employed. These and other advantages of the present invention will become apparent upon reading the following detailed descriptions and studying the various figures of the drawings.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

An invention is described herein a diffuser and a rapid cycle chamber for venting and/or pumping gas. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

Figure 1:
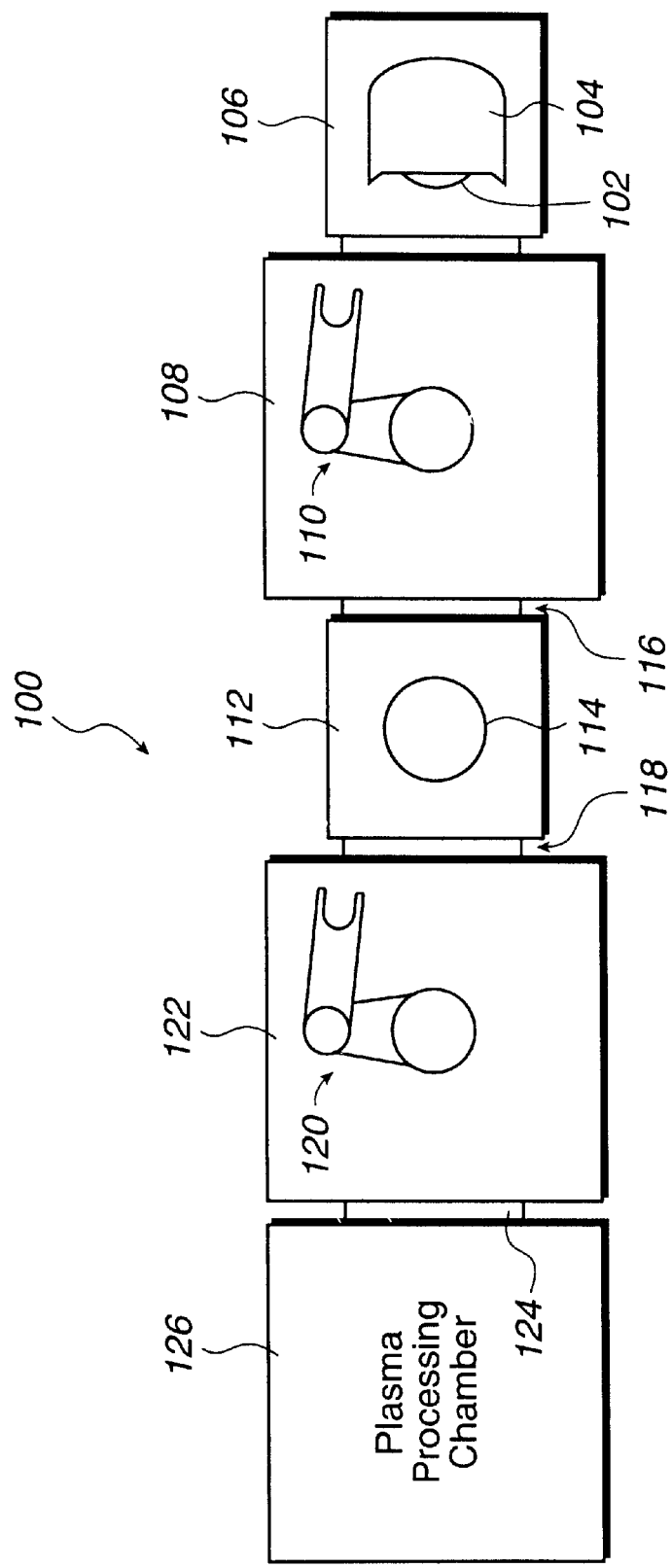
FIG. 1 shows a schematic overview diagram of an exemplary semiconductor processing system with wafer handling automation in accordance with one embodiment of the present invention.

FIG. 1 shows a schematic overview diagram of an exemplary semiconductor processing system 100 with wafer handling automation in accordance with one embodiment of the present invention. To streamline wafer processing, one or more wafers 102 are placed in a wafer cassette 104, which is then placed in a load port 106. A robotic arm 110 in an atmospheric transfer module 108 picks up a wafer 102 from the cassette 104. Both the load port 106 and the atmospheric transfer module 108 contain mostly air at atmospheric pressure.

As the robotic arm 110 picks up the wafer 102, a door 116 in a wafer load lock 112 opens to receive the wafer 102. The robotic arm 110 transfers the wafer 102 upon a wafer support 114 in the wafer load lock 112, which will be at atmospheric pressure with air. Once the wafer 102 has been placed on the wafer support 114 in the wafer load lock 112, the robotic arm 110 withdraws and the door 116 is closed shut. Then, the wafer load lock 112 is "pumped" by pumping the air out of the load lock chamber until a vacuum condition is established in the load lock chamber.

When the load lock 112 is in vacuum condition, a door 118 of the load lock 112 opens to accommodate a vacuum robot arm 120 from a vacuum transfer module 122, which remains in a vacuum condition throughout the process. However, the vacuum transfer module 122 may need to be pumped periodically to ensure optimum vacuum condition or as part of a system startup, or as part of a chamber cleaning. The vacuum robot arm 120 picks up the wafer 102 from the wafer support 114 for transport to a plasma processing chamber 126. Specifically, when a chamber door 124 opens, the vacuum robot arm 120 places the wafer 102 onto a wafer support (not shown) in the plasma processing chamber 126. The plasma processing chamber 126, which is known in the art, is initially in a vacuum condition. After the wafer 102 has been placed in the chamber 126, the chamber door closes 126 and the wafer 102 is typically processed by venting one or more gases (e.g., source gas, plasma, etc.) and pumping the gases out of the chamber 126. In this process, the wafer 102 typically undergoes physical changes as in etching, oxidation, CVD, etc.

After the wafer 102 has been processed, the chamber door 124 opens and the vacuum robot arm 120 removes the wafer 102 from the plasma processing chamber 126. Then, the door 118 of the wafer load lock 112, which is at vacuum condition, opens to receive the processed wafer 102. The vacuum robot arm 120 then places the wafer 102 onto the wafer support 114 and the door 118 on the side of the vacuum transport module 122 closes shut. With both doors 116 and 118 sealed tight, the wafer load lock 112 is "vented" by venting a gas into the wafer load lock 112 until atmospheric pressure is achieved in the chamber. Preferably, the venting gas is clean, dry nitrogen gas.

When atmospheric pressure has been established in the wafer load lock 112, the door 116 on the side of the atmospheric transfer module 108 opens to receive the atmospheric robot arm 110. The robot arm 110 then picks up the processed wafer and transfers it to back to the cassette 104 in the load port 106. When all wafers in the cassette have been similarly processed, the wafers 102 in the cassette 104 may be removed for other processes. It should be noted that the semiconductor process system 100 may have multiple cassettes 104, processing chambers 126, and wafer load locks 112 to allow processing of multiple wafers at the same time.

As can be appreciated, the throughput of the semiconductor process system 100 depends on the efficiency of the chambers 112, 122, and 126 in venting and/or pumping a gas. For example, the faster the wafer load lock 112 is pumped, the sooner the wafer 102 can be placed in the wafer load lock 122 for eventual processing. Similarly, the faster the wafer load lock 112 is vented, the sooner the wafer 102 can be returned to the cassette 104 for other processes. Accordingly, the present invention provides a diffuser in such chambers that can be used to efficiently vent and/or pump gases to increase the throughput of semiconductor process systems.

Figure 2:
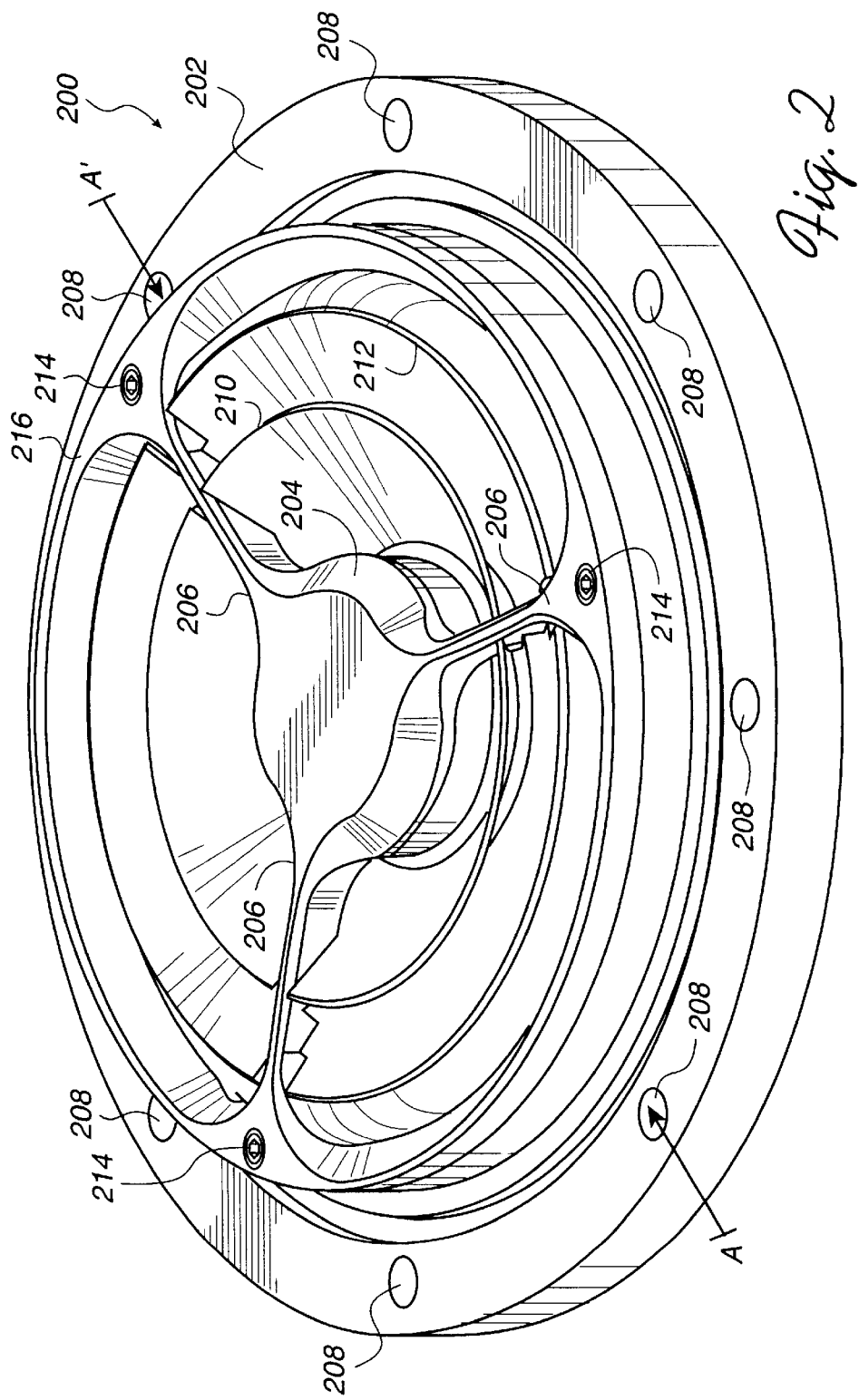
FIG. 2 shows a perspective upper-side view of an exemplary diffuser in accordance with one embodiment of the present invention.

FIG. 2 shows a perspective upper-side view of an exemplary diffuser 200 in accordance with one embodiment of the present invention. The diffuser 200 includes a body 202, a reflector 204, a spider 206, a pair of guide vanes 210 and 212, and a nozzle below the reflector 204 that is not visible in this view. The spider 206 has a set of arms 206 and is fixedly mounted on the body 202 by means of screws 214. The reflector 204 is disposed over the center portion of the body 202 and is mounted on the arms 206 for holding the reflector 204 in place. In addition, the guide vanes 210 and 212 are mounted below the arms 206 and extend downward toward the center of the body below the reflector 204. The arms 206 may be a spider or trivet; however other structures may also be used to mount the reflector 204 and the guide vanes 210 and 212. Preferably, the arms 206 are mounted on the body 202 by means of a ring structure 216. Further, the diffuser 200 may include any number of guide vanes or no vanes at all. The body 202 is preferably in a circular shape; however, it may employ any shape suitable for expanding gas flow.

The diffuser 200 can be used for venting or pumping gas within a semiconductor processing system such as in wafer load lock 112, vacuum atmospheric module 122, and plasma processing chamber 126. In such cases, the body 200 includes a plurality of holes 208 in the ring structure 216 for attaching the diffuser 200 via screws. As used herein, the term "chamber" includes the wafer load lock 112, vacuum atmospheric module 122, plasma processing chamber 126, and any other chambers that requires venting and/or pumping.

Figure 3C:
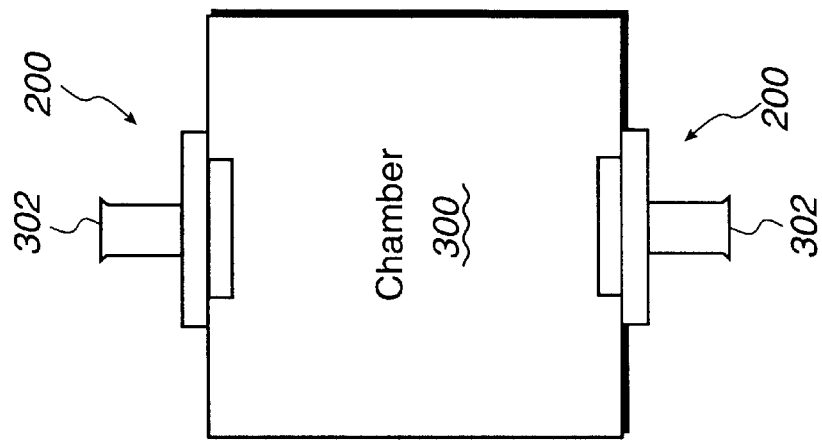
FIGS. 3A to 3C illustrate various ways the diffuser with a nozzle can be placed in a chamber.
Figure 3B:
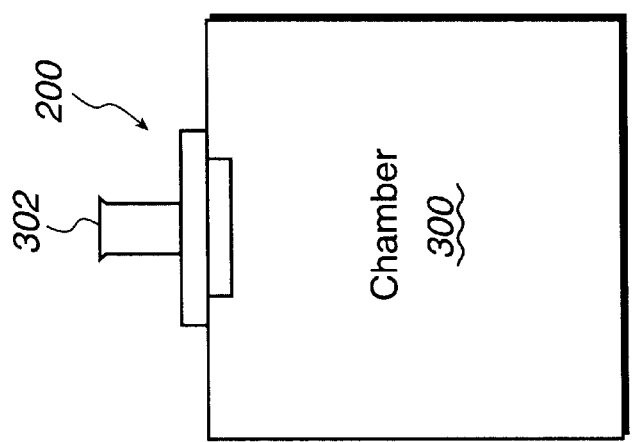
Figure 3A:
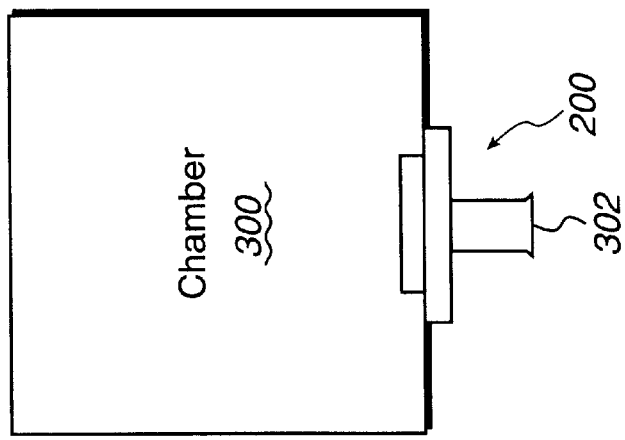

FIGS. 3A to 3C illustrate various ways the diffuser 200 with a nozzle 302 can be placed in a chamber 300. For example, FIG. 3A shows a schematic diagram of the chamber 300 with the diffuser 200 mounted on the floor of the chamber 300 in accordance with one embodiment of the present invention. FIG. 3B, on the other hand, depicts the chamber 300 with the diffuser mounted on the ceiling of the chamber 300 in accordance with another embodiment of the present invention. Alternatively, the diffuser 200 may be provided on both the ceiling and the floor of the chamber 300 as shown in FIG. 3C. The diffuser 200 may also be mounted on side walls of the chamber 300. Preferably, the diffuser 200 is formed of a metal to provide hard surfaced shape.

Figure 4A:
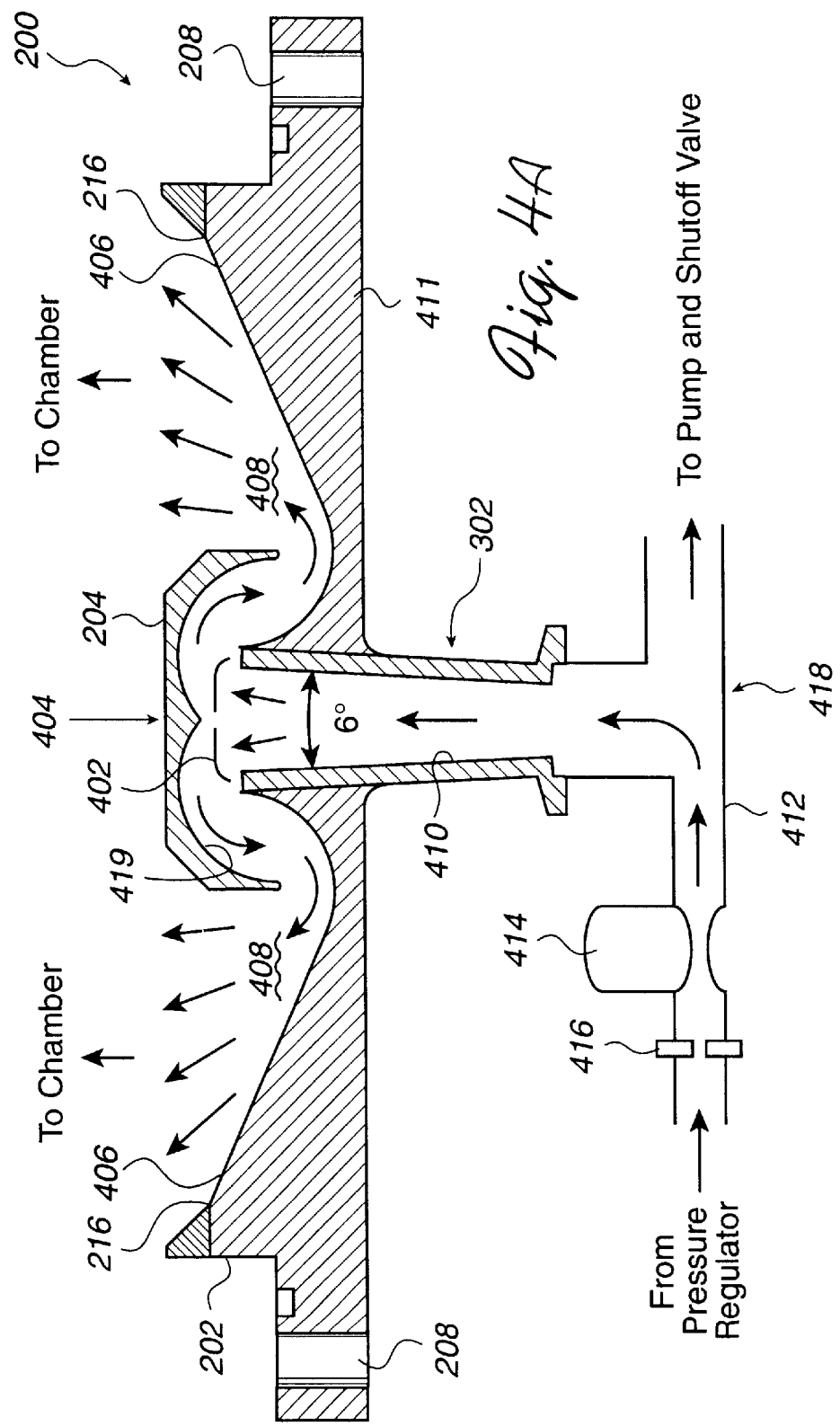
FIG. 4A shows a cross sectional view of the diffuser taken across a line AA' without guide vanes or flow restrictor in accordance with one embodiment of the present invention.

FIG. 4A shows a cross sectional view of the diffuser 200 taken across a line AA' without the guide vanes 210 and 212 in accordance with one embodiment of the present invention. As shown, the diffuser 200 includes the body 202, reflector 204, and nozzle 302. The body 202 is formed to have a hollow 402 in the center 404 to fit the nozzle 302 in the hollow 402. The nozzle 302 can be a separate unit from the body 202 or integral with the body 202. On the upper side of the diffuser 200, a curved surface 406 is formed to define an open space 408 above the curved surface 406 and around the hollow 402. The ring structure 216 is provided at the outer top edge of the curved surface 406 for mounting the arms 206 on the body 202.

The reflector 204 is coaxially disposed over the center 404 of the hollow 402 in the body 202 and is adapted to reflect gas from the nozzle 302 into the open space 408 formed over the curved surface 406. To reflect the gas, the interior surface 419 on the side of the nozzle 302 is curved downward toward the outer bottom edge of the reflector 204. This allows the gas from the nozzle 302 to expand before entering the open space 408.

The nozzle 302 is also coaxially disposed with the hollow 402 in the body 202 and extends below a bottom surface 411 of the body 202. However, the nozzle 302 may also be provided entirely within the hollow 402 without protruding downward. The interior wall 410 is tapered gently such that the diameter of the wall 410 increases gradually toward the reflector 204. Preferably, the interior wall 410 of the nozzle 302 is formed at an angle less than or equal to six degrees over its diameter. The sloping angle of the interior wall 410 allows a gas entering the nozzle 302 to gradually expand during traversal upward through the nozzle.

In one embodiment, the diffuser 200 may also include an inlet 412, a valve 414, and a flow restrictor 416. When venting a gas such as $N_2$, a pressure regulator provides gas at the upstream of the flow restrictor 416 to the inlet 412 at the downstream. The flow restrictor 416 is adapted to limit the gas flow from the pressure regulator and it may be implemented using a disk with a hole in the center to allow the gas to pass through. The diameter of the hole can be adjusted to provided desired flow restrictions. The valve 414 is a shutoff valve that either allows the gas to flow into the nozzle 302 via inlet 412 or shuts off the gas to prevent passage of the gas into the nozzle 302 when the diffuser 200 is operating in a pumping mode.

The location of the flow restrictor 416 may be varied in some embodiments. For example, if the flow restrictor 416 is to be located upstream, it is preferably located as close to the valve 414 as possible. In one embodiment, the flow restrictor 416 may be incorporated within the valve 414. In another embodiment, the flow restrictor 416 may be located down stream of the valve 414 and is arranged so that the flow below the restrictor becomes substantially uniform before entering the nozzle 302. The flow restrictor 416 also allows for linear in time chamber filling or only initially linear chamber filling, depending on the input pressure.

In the pumping mode, the diffuser 200 is coupled to a pump by means of a T-shape pipe 418. On one side, the T-shape pipe 418 is coupled to the inlet 412 for use in venting gas through the diffuser 200. On the other side, the T-shape pipe is coupled to a pump (not shown) to pump gas from the chamber via diffuser 200 to provide a vacuum condition in the chamber.

In operation, the gas flows at high pressure at the upstream of the flow restrictor 416. The diameter of the hole in the flow restrictor 416 and the upstream pressure determine the mass flow independently of the downstream pressure as long as the downstream/upstream pressure ratio is maintained less the a critical pressure ratio (e.g., 0.528 for $N_2$). The flow restrictor 416 limits the gas flow and accelerates the gas flow to a high speed (e.g., sonic speed). In addition, the flow restrictor 416 prevents a burst of gas from flowing into the chamber when the vent valve 414 is opened. Accordingly, the constant mass flow allows controlled regulation of the chamber vent time and maximum vent pressure.

Downstream of the flow restrictor 416, the pressure is near the chamber pressure because of the low restriction in the diffuser 200, which functions to expand the flow of gas into the chamber. Alternating between venting and pumping, the chamber pressure ranges between the vacuum base pressure at the start of the chamber vent and the maximum chamber pressure, which is usually the atmospheric pressure as gas is flowed into the chamber.

The diffuser 200 functions to regulate the gas flow through the hole in the flow restrictor 416 and then to slow the gas velocity from that in the inlet 412 downstream of the hole by expanding the flow area gradually so that a low uniform velocity gas flow enters the chamber through a large area. Specifically, the gas flow entering the nozzle 302 is slowed within the nozzle 302 by the tapered wall 410, which expands at an angle less than or equal to 6 degrees. Then, the flow from the nozzle 302 is directed to the reflector 204, which reflects and further expands the gas flow into the open space 408 in the diffuser 200. On leaving the reflector 204, the flow enters the open space 408, where the gas flow is further expanded to the full open area of the diffuser 200. Preferably, the volume of the diffuser 200 is kept to a minimum so that the chamber can be emptied (i.e., pumped) in minimum time.

Figure 4B:
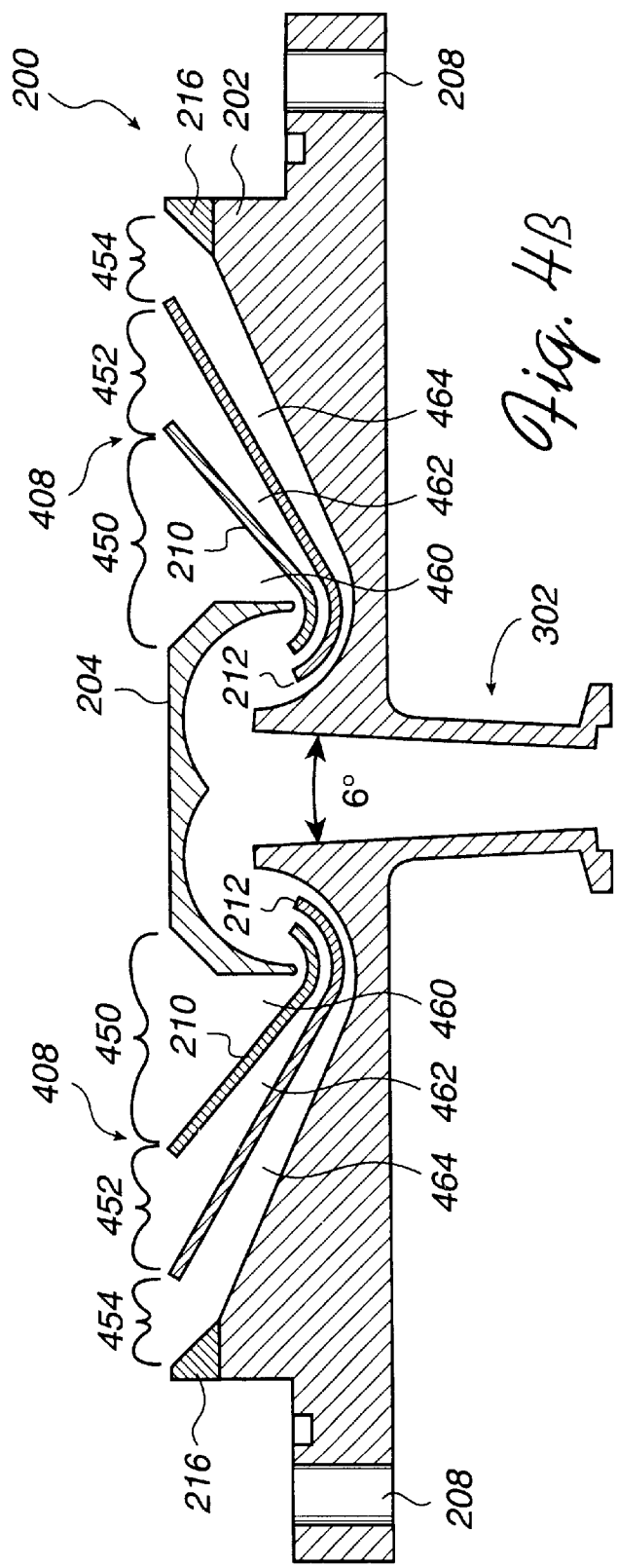
FIG. 4B shows a cross sectional view of the diffuser taken across the line AA' with guide vanes in accordance with one embodiment of the present invention.

The diffuser 200 may also have a set of guide vanes to partition the open space 408 to provide flow velocity uniformity. FIG. 4B shows a cross sectional view of the diffuser 200 taken across the line AA' with the guide vanes 210 and 212 in accordance with one embodiment of the present invention. As shown, the guide vanes 210 and 212 are provided in the open space 408 of the diffuser 200. In this configuration, the guide vanes 210 and 212 are arranged to partition the open space 308 into expansion spaces 460, 462, and 464. For example, the guide vane 210 partitions the open space 308 into expansion spaces 460 and 462 while the guide vane 212 partitions the open space 308 into expansion spaces 462 and 464.

Preferably, the guide vanes 210 and 212 are spaced such that the annular areas 450, 452, and 454 facing the chamber are equal. The equal annular areas 450, 452, and 454 allows substantially equal amount of gas flows into the chamber from the expansion spaces 460, 462, and 464, respectively. In one embodiment, the guide vanes 210 and 212 may be adjusted vertically and/or horizontally to provide achieve flow uniformity.

The present invention provides substantial advantages over conventional diffusers. The diffuser of the present invention may be used to vent gas into a chamber or pump the gas out of a chamber to provide a vacuum condition. When used in venting gas into the chamber, for example, gas through the nozzle and reflector expands incoming gas flow. The reflector reflects the gas into the expansion space where the gas flow is further slowed and expanded to provide substantially uniform gas flow into the chamber.

Due to the low and uniform gas flow into the chamber from the expansion space, wafers in the chamber will not be moved out of position. Further, minute particles within the chamber are less likely to be stirred onto a wafer in the chamber. Accordingly, the diffuser and chamber equipped with such a diffuser of the present invention increase wafer throughput in a semiconductor processing system.

When used in pumping, on the other hand, the chamber can be pumped to vacuum more rapidly as there is no volume connected to the chamber via a restriction. In addition, the chamber need not employ a separate pumping port or device, thereby saving space in the chamber. In this mode, the flow restrictor of the present invention allows more rapid pumping of the chamber to achieve vacuum because there is no volume connected to the chamber.

The present invention also provides other practical and cost advantages. For example, the diffuser of the present invention is relatively easy to clean because there are no fabric, sintered metal, or porous wall surfaces of conventional diffusers having membranes. The hard surfaced shape of the diffuser of the present invention ensures that the parts will not wear out or become clogged. In addition, the diffuser of the present invention is cheaper to produce and maintain than the conventional membrane diffusers.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A diffuser, comprising:
    a body having a nozzle through a center portion, the body having a curved surface on an upper side to define an open space above the curved surface, wherein the nozzle is arranged to allow a gas to flow through and expand in the nozzle;
    a reflector disposed over the nozzle and being arranged to reflect the gas from the nozzle into the open space in the body while expanding the gas flow, wherein the nozzle, reflector, and the open space are configured to slow the flow of the gas such that the gas flows out of the open space with substantially uniform or other intended non-uniform low velocity; and
    a set of vanes disposed in the open space of the body for partitioning the open space into a set of expansion spaces such that the gas flows out of each expansion space in substantially equal amounts.

2. The diffuser as recited in claim 1, wherein the nozzle is formed integral with the body.

3. The diffuser as recited in claim 1, wherein the nozzle is formed separate from the body.

4. The diffuser as recited in claim 1, wherein the reflector is coaxially disposed over the nozzle.

5. The diffuser as recited in claim 4, wherein the set of arms is attached to the set of vanes for holding the set of vanes in place.

6. The diffuser as recited in claim 1, wherein the curved surface of the body is arranged to expand the open space radially such that the flow of the gas expands in the open space.

7. The diffuser as recited in claim 1, further comprising:
    a set of arms mounted on the upper side of the body for holding the reflector in place.

8. The diffuser as recited in claim 1, wherein the nozzle has an interior wall that is tapered to increase in diameter toward the reflector.

9. The diffuser as recited in claim 8, wherein the interior wall of the nozzle is tapered at an angle less than or equal to six degrees.

10. The diffuser as recited in claim 1, further comprising:
    an inlet coupled to the nozzle to flow the gas into the nozzle; and
    a flow restrictor disposed on the inlet to limit an input velocity of an input gas, wherein the flow restrictor decreases the input velocity of the gas.

11. The diffuser as recited in claim 10, wherein the flow restrictor is a disk having an orifice to allow passage of the input gas into the inlet.

12. The diffuser as recited in claim 11, further comprising:
    a valve coupled between the inlet and the flow restrictor, the valve being arranged to open to allow the passage of the input gas into the inlet when the diffuser is being used to diffuse the gas through the open space, wherein the valve is arranged to shut to prevent the passage of the input gas into the inlet when the diffuser is used to pump the gas from the diffuser.

13. A chamber for cycling gas in a semiconductor processing system, the chamber comprising:
  a set of enclosed walls; and
  a diffuser mounted on an aperture in an enclosed wall of the chamber, the diffuser including:
    a body having a nozzle through a center portion, the body having a curved surface on an upper side to define an open space above the curved surface, wherein the nozzle is arranged to allow a gas to flow through and expand through the nozzle;
    a reflector disposed over the nozzle and being arranged to reflect the gas from the nozzle into the open space in the body while expanding the gas flow, wherein the flow of the gas expands in the open space such that the gas flows out of the open space into the chamber with substantially uniform velocity that is lower than a velocity of the gas entering the nozzle; and
    a set of vanes disposed in the open space of the body for partitioning the open space into a set of expansion spaces such that the gas flows out of each expansion space in substantially equal amount into the chamber.

14. The chamber as recited in claim 13, wherein the nozzle is formed integral with the body.

15. The chamber as recited in claim 13, wherein the nozzle is formed separate from the body.

16. The chamber as recited in claim 13, the reflector is coaxially disposed over the nozzle.

17. The chamber as recited in claim 13, wherein the diffuser further comprises:
  a set of arms mounted on the upper side of the body for holding the reflector in place.

18. The chamber as recited in claim 17, wherein the set of arms is attached to the vanes for holding the vanes in place.

19. The chamber as recited in claim 17, wherein the nozzle has an interior wall that is tapered to increase in diameter toward the reflector.

20. The chamber as recited in claim 19, wherein the interior wall of the nozzle is tapered at an angle less than or equal to six degrees.

21. The chamber as recited in claim 13, wherein the diffuser further comprises:
  an inlet coupled to the nozzle to flow the gas into the nozzle;
  a flow restrictor disposed on the inlet to limit an input velocity of an input gas, wherein the flow restrictor decreases the input velocity of the input gas for output to the inlet.

22. The chamber as recited in claim 21, wherein the flow restrictor is a disk having an orifice to allow passage of the input gas into the inlet.

23. The chamber as recited in claim 21, wherein the diffuser further comprises:
  a valve coupled between the inlet and the flow restrictor, the valve being arranged to open to allow the passage of the input gas into the inlet when the diffuser is being used to diffuse the gas through the open space, wherein the valve is arranged to shut to prevent the passage of the input gas into the inlet when the diffuser is used to pump the gas from the diffuser.

24. The chamber as recited in claim 13, wherein the enclosed wall on which the diffuser is mounted is a floor of the chamber.

25. The chamber as recited in claim 13, wherein the enclosed wall on which the diffuser is mounted is a ceiling of the chamber.

26. A device for venting gas, comprising:
  a body having a nozzle through a center portion, the body having a curved surface on an upper side to define an expansion space above the curved surface for expanding gas flow, wherein the nozzle is arranged to allow a gas to flow through and expand through the nozzle;
  a reflector disposed over the nozzle and being arranged to reflect the gas from the nozzle into the expansion space in the body while expanding the gas flow, wherein the flow of the gas expands in the expansion space such that the gas flows out of the expansion space with substantially uniform velocity that is lower than a velocity of the gas from the nozzle when venting the gas;
  an inlet coupled to the nozzle to flow the gas into the nozzle; and
  a flow restrictor disposed on the inlet to limit an input velocity of an input gas, wherein the flow restrictor decreases the input velocity of the input gas for output to the inlet.

27. The device as recited in claim 26, wherein the nozzle is formed integral with the body.

28. The device as recited in claim 26, wherein the nozzle is formed separate from the body.

29. The device as recited in claim 26, wherein the reflector is coaxially disposed over the nozzle.

30. The device as recited in claim 26, wherein the curved surface of the body is arranged to expand the expansion space radially such that the flow of the gas expands in the expansion space.

31. The device as recited in claim 26, further comprising:
  a set of vanes disposed in the expansion space of the body for partitioning the expansion space into a set of expansion spaces such that the gas flows out of each expansion space in substantially equal amount.

32. The device as recited in claim 26, further comprising:
  a set of arms mounted on the upper side of the body for holding the reflector in place.

33. The device as recited in claim 32, wherein the set of arms is attached to the vanes for holding the vanes in place.

34. The device as recited in claim 33, further comprising:
  a valve coupled between the inlet and the flow restrictor, the valve being arranged to open to allow the passage of the input gas into the inlet when the diffuser is being used to diffuse the gas through the expansion space, wherein the valve is arranged to shut to prevent the passage of the input gas into the inlet when the diffuser is used to pump the gas from the diffuser.

35. The device as recited in claim 26, wherein the nozzle has an interior wall that is tapered to increase in diameter toward the reflector.

36. The device as recited in claim 35, wherein the interior wall of the nozzle is tapered at an angle less than or equal to six degrees.

37. The device as recited in claim 26, the flow restrictor is a disk having an orifice to allow passage of the input gas into the inlet.

* * * * *